United States Patent
Wako et al.

(10) Patent No.: US 7,202,896 B2
(45) Date of Patent: Apr. 10, 2007

(54) SOLID STATE IMAGE PICKUP DEVICE HAVING SPECTRAL DEVICE

(75) Inventors: Hideki Wako, Miyagi (JP); Shinji Uya, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 750 days.

(21) Appl. No.: 10/361,624

(22) Filed: Feb. 11, 2003

(65) Prior Publication Data

US 2003/0156210 A1 Aug. 21, 2003

(30) Foreign Application Priority Data

Feb. 21, 2002 (JP) .............................. 2002-045011

(51) Int. Cl.
  H04N 5/335 (2006.01)
  H04N 3/14 (2006.01)
  H04N 9/04 (2006.01)
(52) U.S. Cl. ..................... 348/277; 348/281; 348/282; 348/315
(58) Field of Classification Search ......... 348/290–293
  See application file for complete search history.

(56) References Cited

U.S. PATENT DOCUMENTS

| | | | |
|---|---|---|---|
| 4,079,411 A * | 3/1978 | Engelbrecht et al. | 348/336 |
| 4,675,727 A * | 6/1987 | Sekizawa et al. | 348/340 |
| 5,210,400 A * | 5/1993 | Usami | 250/208.1 |
| 5,223,703 A * | 6/1993 | Setani | 250/208.1 |
| 5,362,957 A * | 11/1994 | Nakai et al. | 359/569 |
| 5,471,515 A * | 11/1995 | Fossum et al. | 257/294 |
| 5,481,383 A | 1/1996 | Morishima et al. | |
| 5,497,269 A * | 3/1996 | Gal | 359/565 |
| 5,529,936 A | 6/1996 | Rostoker | |
| 5,621,487 A * | 4/1997 | Shirochi | 348/292 |
| 5,682,265 A * | 10/1997 | Farn et al. | 359/571 |
| 6,137,535 A * | 10/2000 | Meyers | 348/340 |
| 6,522,356 B1 * | 2/2003 | Watanabe | 348/275 |
| 6,738,171 B1 * | 5/2004 | Campbell | 257/435 |
| 2002/0135825 A1 * | 9/2002 | Lee et al. | 358/509 |

FOREIGN PATENT DOCUMENTS

| | | |
|---|---|---|
| EP | 0 583 150 A1 | 2/1994 |
| EP | 0 750 207 A2 | 12/1996 |
| EP | 1 091 567 A2 | 4/2001 |
| JP | 11-295513 | 10/1999 |

* cited by examiner

Primary Examiner—David Ometz
Assistant Examiner—Nhan T. Tran
(74) Attorney, Agent, or Firm—Arent Fox LLP

(57) ABSTRACT

A spectral device is disposed above a semiconductor substrate formed with a number of photoelectric conversion elements. The spectral device has a plurality of spectral regions each corresponding to a plurality of photoelectric conversion elements, each of the spectral regions spectroscopically splitting light fluxes of a plurality of colors necessary for color imaging and contained in incidence light toward different directions, each of the spectroscopically split light fluxes becoming incident upon an associated photoelectric conversion element among the plurality of photoelectric conversion elements corresponding to each of the spectral regions.

5 Claims, 14 Drawing Sheets

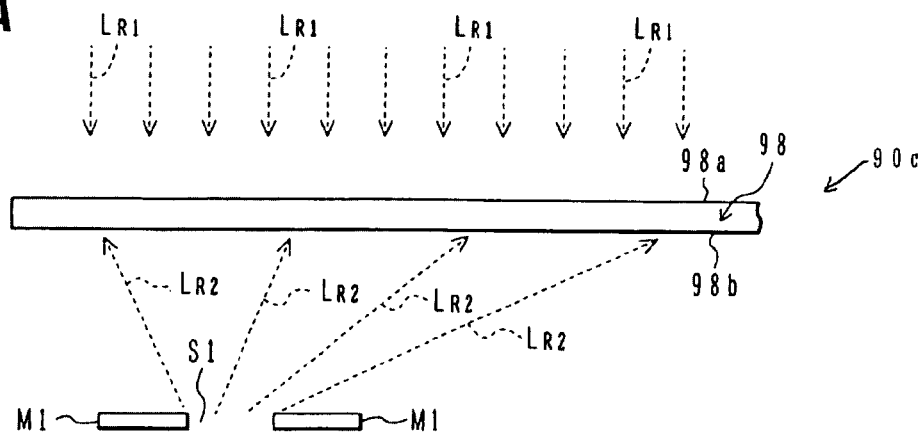
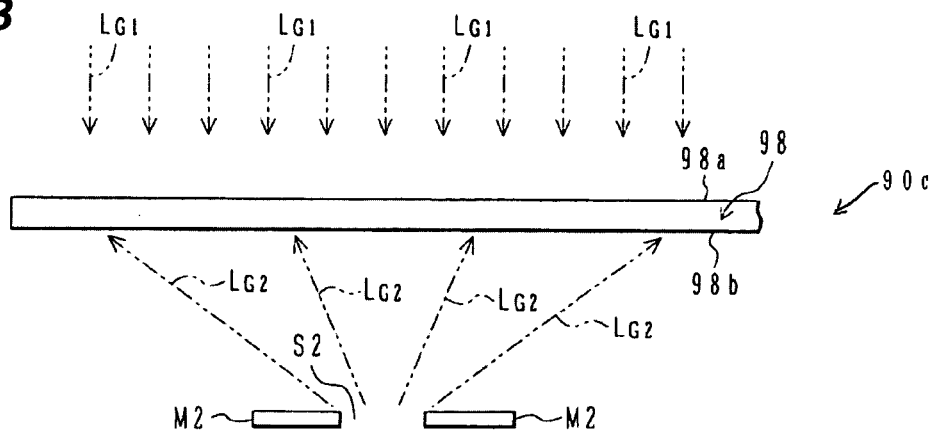
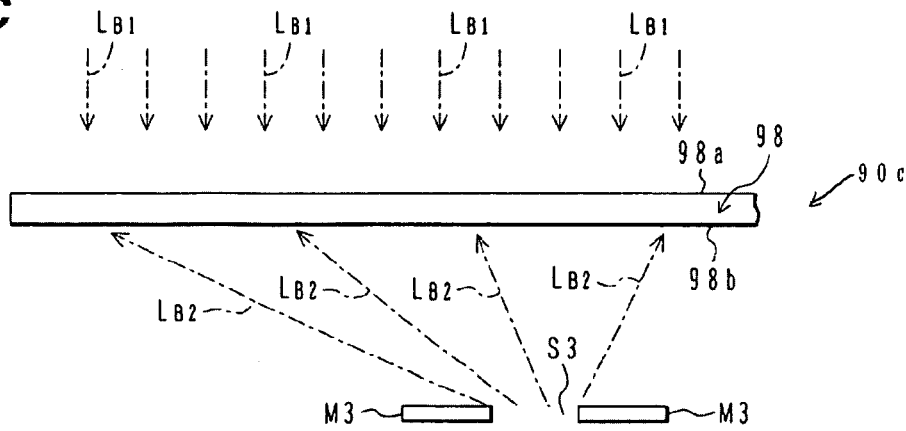

SOLID STATE IMAGE PICKUP DEVICE HAVING SPECTRAL DEVICE

CROSS REFERENCE TO RELATED APPLICATION

This application is based on Japanese Patent Application No. 2002-045011, filed on Feb. 21, 2002, the entire contents of which are incorporated herein by reference.

BACKGROUND OF THE INVENTION

A) Field of the Invention

The present invention relates to a solid state image pickup device, and more particularly to a solid state image pickup device to be used for a single plate image pickup apparatus.

B) Description of the Related Art

Charge coupled device (CCD) type and metal-oxide-semiconductor (MOS) type solid state image pickup devices are used as area image sensors of image pickup apparatuses such as video cameras and still image digital cameras.

CCD and MOS solid state image pickup devices have a number of photoelectric conversion elements disposed in and on the principal surface of a semiconductor substrate in a matrix shape having a plurality of rows and columns and generate output signals (pixel signals) from electric charges accumulated in these photoelectric conversion elements upon incidence of light. In many solid state image pickup devices, photoelectric conversion elements and an output signal generator unit for generating a pixel signal are integrated on the same semiconductor substrate.

The output signal generator can be classified into two types depending upon the structure. One type of the output signal generator transfers charges accumulated in photoelectric conversion elements to a charge detector circuit by using one or two kinds of charge transfer units constituted of CCDs and generates output signals at the charge detector circuit.

A CCD solid state image pickup device used as an area image sensor generally has a first charge transfer unit (hereinafter called a "vertical charge transfer unit") provided for each photoelectric conversion column and a second charge transfer unit (hereinafter called a "horizontal charge transfer unit"; electrically connected to the vertical charge transfer units. CCDs can be made by forming a channel in a surface layer of a semiconductor substrate and forming a plurality of electrodes (transfer electrodes) on an electrically insulating film formed on the surface of the channel.

The other type of the output signal generator is a MOS solid state image pickup device. In this generator, a photoelectric conversion element is connected via a transistor to an output signal line, and an output signal is generated by forming a voltage or current signal on the output signal line corresponding to the charges accumulated in the photoelectric conversion element. The transistor is a switching element or the like which electrically connects the photoelectric conversion element and the output signal line at a predetermined timing.

A CCD or MOS solid state color image pickup device used by a single plate image pickup apparatus has generally a color filter array disposed above photoelectric conversion elements. This color filter array has color filters of a plurality of colors disposed in a predetermined pattern. One color filter is provided for each photoelectric conversion element. There are primary color filters and complementary color filters.

In order to increase the amount of incidence light upon each photoelectric conversion element, a micro lens array is disposed above the color filter array in many cases. This micro lens array has a number of micro lenses each disposed corresponding to each photoelectric conversion element.

In a conventional solid state image pickup device having a color filter array and a micro lens array, light fluxes having a variety of wavelengths converged by a micro lens become incident upon the underlying color filter. Light capable of entering each photoelectric conversion element is only the light having wavelengths in a predetermined range capable of transmitting through the color filter above the photoelectric conversion element, excluding stray light.

For example, if a solid state image pickup device has a primary color filter array of red, green and blue filters, light capable of being incident upon the photoelectric conversion element under the red filter is only red light in a predetermined wavelength range capable of transmitting through the red filter. Green and blue light entered the red filter cannot become incident upon the photoelectric conversion element under the red filter.

Each photoelectric conversion element generates charges corresponding to the amount of incident light. If the amount of incident light is small, the amount of charges accumulated in the photoelectric conversion element is also small.

Recent solid state image pickup devices have a high resolution and a high integration of photoelectric conversion elements. Micro lenses and underlying photoelectric conversion elements are becoming small. Even if a micro lens is used, the amount of incident light upon a small photoelectric conversion element decreases and the sensitivity of the solid state image pickup device is likely to be lowered.

SUMMARY OF THE INVENTION

An object of this invention is to provide a solid state image pickup device capable of increasing the amount of incident light upon each photoelectric conversion element.

According to one aspect of the present invention, there is provided a solid state image pickup device comprising: a semiconductor substrate; a number of photoelectric conversion elements disposed in a surface layer of the semiconductor substrate in a matrix shape having a plurality of rows and columns; an output signal generator unit capable of generating an output signal from charges accumulated in each of the photoelectric conversion elements; and a spectral device disposed above the semiconductor substrate and covering the photoelectric conversion elements as viewed in plan, the spectral device having a plurality of spectral regions each corresponding to a plurality of photoelectric conversion elements, each of the spectral regions spectroscopically splitting light fluxes of a plurality of colors necessary for color imaging and contained in incidence light toward different directions, each of the spectroscopically split light fluxes becoming incident upon an associated photoelectric conversion element among the plurality of photoelectric conversion elements corresponding to each of the spectral regions.

In the solid state image pickup device, light fluxes of a plurality of colors necessary for color imaging and contained in light incident upon the spectral region corresponding to a plurality of photoelectric conversion elements, e.g., red, green and blue light fluxes, are made to enter respective photoelectric conversion elements among the plurality of photoelectric conversion elements corresponding to the spectral region.

As compared to a conventional solid state image pickup device, the amount of light incident upon each photoelectric conversion element can be increased.

In this manner, a solid state image pickup device is provided which can increase the amount of light incident upon each photoelectric conversion element. A solid state image pickup device having a high sensitivity can be provided.

BRIEF DESCRIPTION OF THE DRAWINGS

FIGS. 5A, 5B and 5C are side views illustrating the manufacture processes of a spectral device constituted of a holographic device.

DESCRIPTION OF THE PREFERRED EMBODIMENTS

Figure 1:
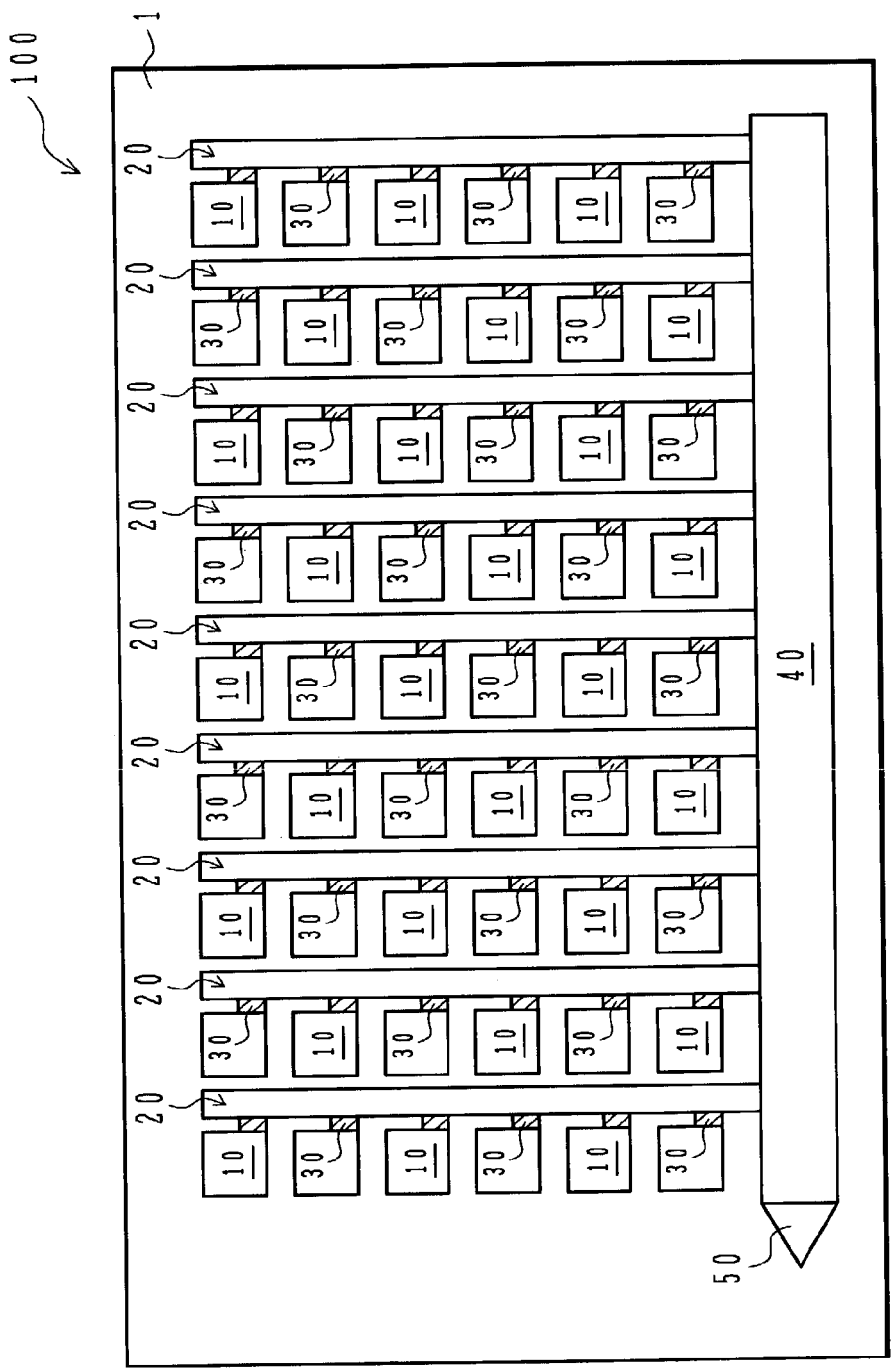
FIG. 1 is a schematic diagram showing a plan layout of photoelectric conversion elements, first charge transfer units (vertical charge transfer units), a second charge transfer unit (horizontal charge transfer unit) and a charge detector circuit, respectively of a solid state image pickup device according to a first embodiment.

FIG. 1 is a schematic diagram showing a plan layout of photoelectric conversion elements 10, first charge transfer units (vertical charge transfer units) 20, a second charge transfer unit (horizontal charge transfer unit) 40 and a charge detector circuit 50, respectively of a solid state image pickup device 100 according to a first embodiment.

The solid state image pickup device 100 used as an area image sensor has a number of photoelectric conversion elements 10 disposed on the principal surface of a semiconductor substrate 1 in a square matrix shape having a plurality of rows and columns (inclusive of the same number of rows and columns). The total number of photoelectric conversion elements of an actual solid state image pickup device used as an area image sensor is, for example, several hundred thousand to several million.

Each photoelectric conversion element 10 is, for example, made of a buried type pn junction photodiode and has a rectangular shape as viewed in plan. As light becomes incident upon the photoelectric conversion element 10, charges are accumulated in this element.

The vertical charge transfer unit 20 is disposed along each photoelectric conversion element column to transfer charges accumulated in each photoelectric conversion element 10 toward the charge detector circuit 50. Each vertical charge transfer unit 20 is constituted of four-phase drive type CCDs for example.

In order to control reading charges from the photoelectric conversion element 10, each vertical charge transfer unit 20 has a read gate 30 provided for each photoelectric conversion element 10. In FIG. 1, the read gate 30 is shown hatched in order to locate the position thereof easily.

As a read pulse (e.g., about 15 V) is applied to the read gate 30, charges are read from the photoelectric conversion element 10 corresponding to the read gate 30 to the vertical charge transfer unit 20. Reading charges from the photoelectric conversion element 10 to the vertical charge transfer unit 20 is performed in the unit of photoelectric conversion element row.

Each vertical charge transfer unit 20 is driven by predetermined drive signals to transfer charges read from the photoelectric conversion element 10 to the horizontal charge transfer unit 40.

The horizontal charge transfer unit 40 is constituted of two-phase drive type CCDs for example. The horizontal charge transfer unit 40 transfers charges of each one row received from the vertical charge transfer units 20 to the charge detector circuit 50.

The charge detector circuit 50 sequentially detects and amplifies charges transferred from the horizontal charge transfer unit 40 to generate signal voltages and sequentially generate pixel signals.

For example, the charge detector circuit 50 is constituted of an output gate electrically connected to the output terminal of the horizontal charge transfer unit 40, a floating diffusion region (hereinafter abbreviated to an "FD region") formed in the semiconductor substrate 1 adjacent to the output gate and a floating diffusion amplifier (hereinafter abbreviated to an "FDA") electrically connected to the FD region.

The output gate controls the charge transfer from the horizontal charge transfer unit 40 to the FD region. The potential of the FD region changes in accordance with the charge amount in the FD region. FDA amplifies the potential change of the FD region and generates pixel signals. These pixel signals are output from the solid state image pickup device 100.

A reset gate is disposed adjacent to the FD region, and a reset drain region is formed in the semiconductor substrate 1 adjacent to the reset gate. The FD region, reset gate and reset drain region constitute a reset transistor.

Charges detected by FDA or charges unnecessary for the detection by FDA are drained from the FD region to the reset drain region via the reset gate, and absorbed in the power supply voltage for example.

In the solid state image pickup device 100 constructed as above, the vertical charge transfer units 20, horizontal charge transfer unit 40 and charge detector circuit 50 constitute the output signal generator unit.

One feature of the solid state image pickup device 100 is that a specific spectral device is disposed above the semiconductor substrate.

Figure 2:
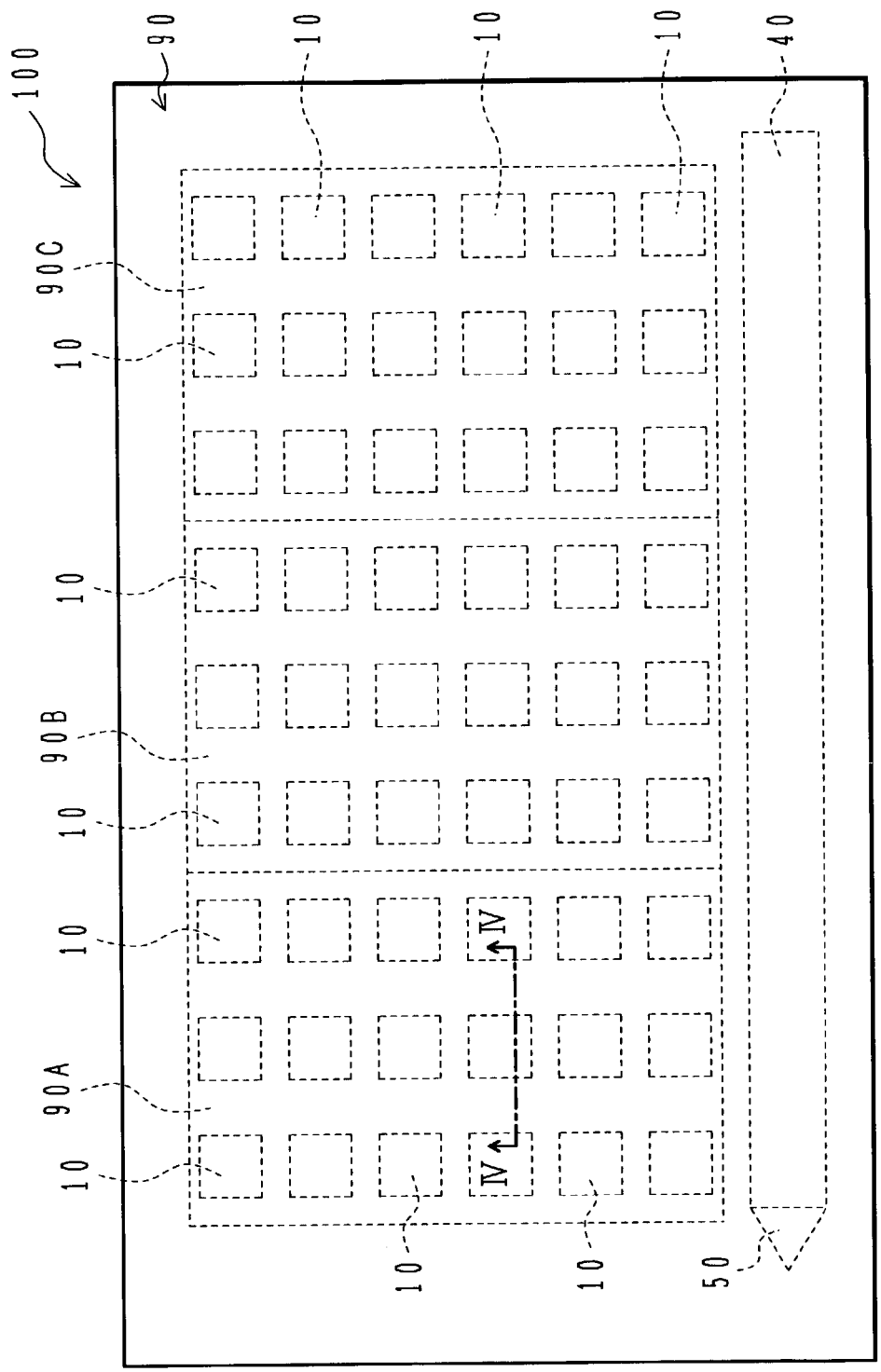
FIG. 2 is a top view schematically showing the solid state image pickup device shown in FIG. 1.

FIG. 2 is a schematic top view of the solid state image pickup device 100. A spectral device 90 disposed at the uppermost layer of the solid state image pickup device 100 has a plurality of spectral regions 90A, 90B and 90C. Three photoelectric conversion element columns are disposed in each spectral region.

Figure 3:
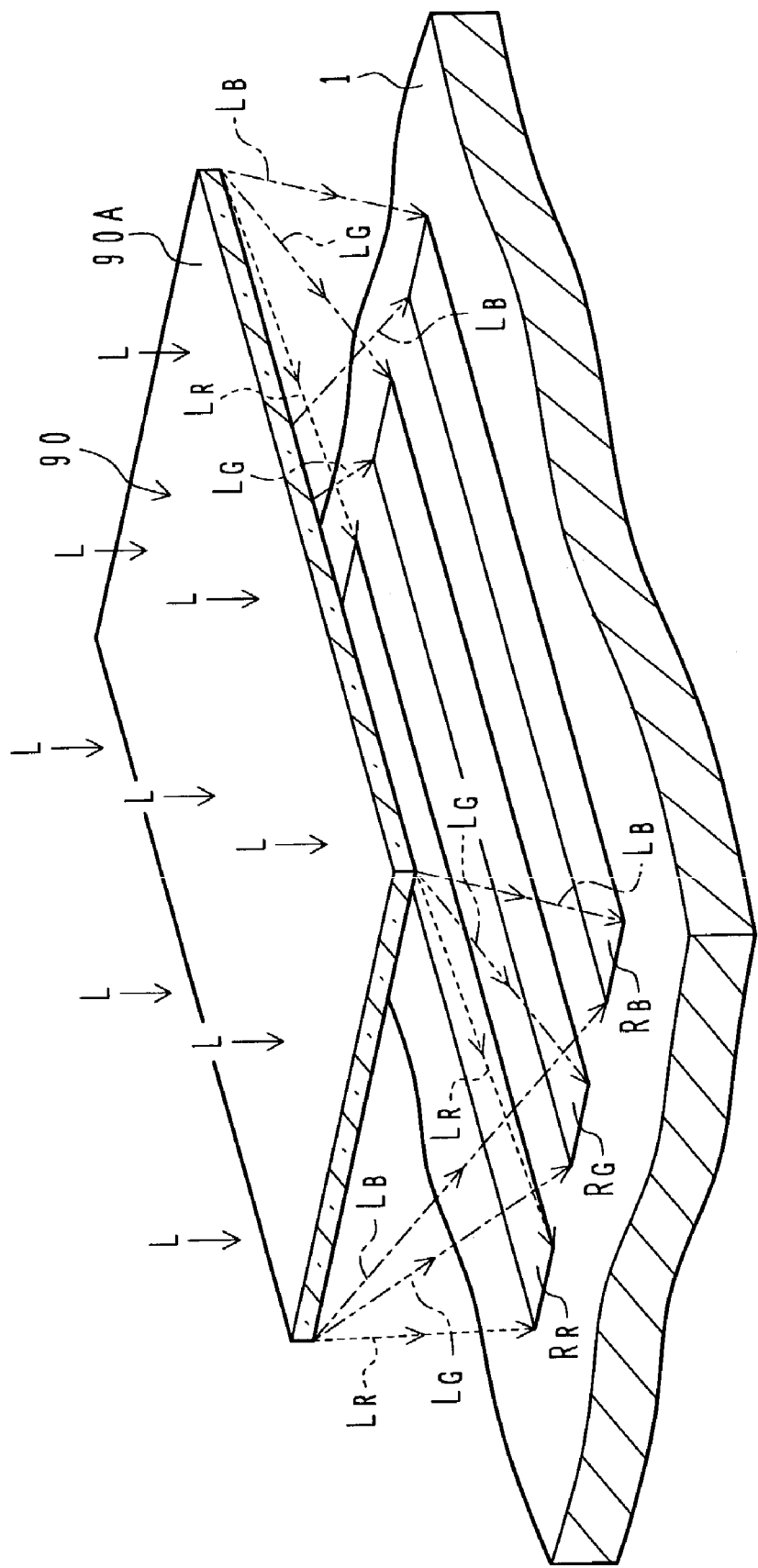
FIG. 3 is a perspective view showing the spectral characteristics of a spectral region shown in FIG. 2.

FIG. 3 is a schematic perspective view showing the spectral characteristics of the spectral region 90A shown in FIG. 2. The spectral region 90A directs red light $L_R$, green light $L_G$ and blue light $L_B$ contained in incident light L toward different regions on the semiconductor substrate 1. Assuming that the refractive indices in the region between the spectral region 90A and semiconductor substrate 1 are uniform, the red light $L_R$ is directed toward a surface region $R_R$ of the semiconductor substrate 1, the green light $L_G$ is directed toward a surface region $R_G$, and the blue light $L_B$ is directed toward a surface region $R_B$. The spectral characteristics of the spectral regions 90B and 90C are similar to those of the spectral region 90A. Directing different color light toward different regions can be performed by refraction or diffraction. Separating light in this way is hereinafter called "spectroscopically splitting light".

In the solid state image pickup device 100, the red light $L_R$ spectroscopically split by the spectral region 90A becomes incident upon the light reception plane of each photoelectric conversion element 10 in one of three photoelectric conversion element columns (e.g., the left-most photoelectric conversion element column as viewed in FIG. 2), the green light $L_G$ becomes incident upon the light reception plane of each photoelectric conversion element 10 in the middle photoelectric conversion element column, and the blue light $L_B$ becomes incident upon the light reception plane of each photoelectric conversion element 10 in the right-most photoelectric conversion element column. The positional relation between each of the spectral regions 90B and 90C and corresponding three photoelectric conversion element columns is similar to that between the spectral region 90A and corresponding three photoelectric conversion element columns.

Each area of the spectral regions 90A to 90C of the spectral device 90 of the solid state image pickup device 100 as viewed in plan can cover the three photoelectric conversion element columns. As compared to a conventional solid state image pickup device, the amount of incident red, green or blue light upon each photoelectric conversion element can be increased and the sensitivity of the solid state image pickup device can be increased.

The spectral device 90 as the characteristic feature of the solid state image pickup device 100 is made of, for example, a diffraction optical device (inclusive of a holographic device).

Figure 4A:
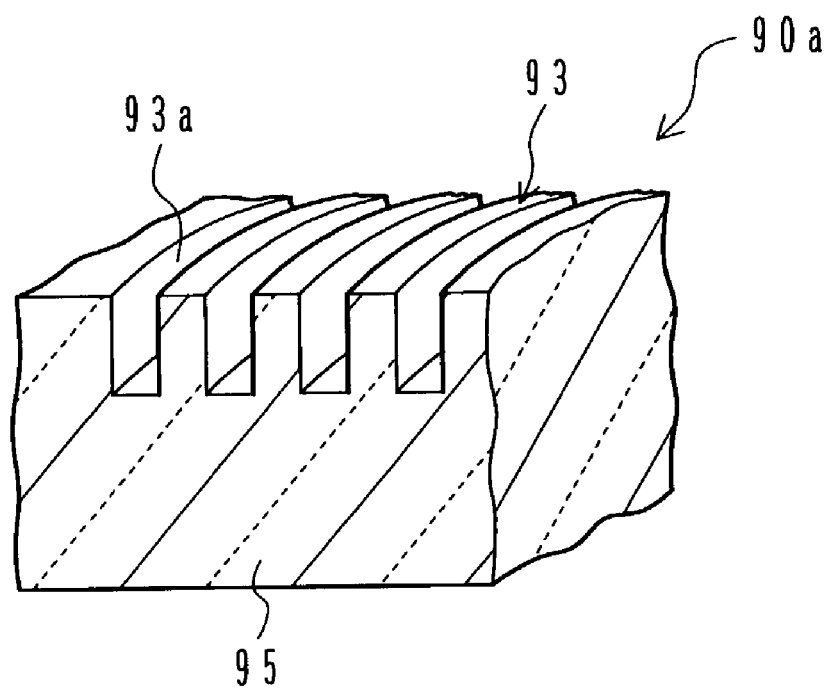
FIG. 4A is a perspective view showing part of a spectral device constituted of a diffraction device having a diffraction grating pattern.

FIG. 4A is a perspective view showing part of the spectral device 90a made of a diffraction optical device having a diffraction grating pattern 93. For example, the diffraction grating pattern 93 is formed by forming a number of grooves 93a having a rectangular cross section in a transparent material layer 95 made of transparent resin or the like. The spectral device 90a has the refraction grating pattern 93 of the same shape in each spectral region.

The diffraction grating pattern 93 can be made by patterning one side of the transparent resin layer 95 by using as a mask a fine pattern formed by lithography such as photolithography and electron beam lithography.

Figure 4B:
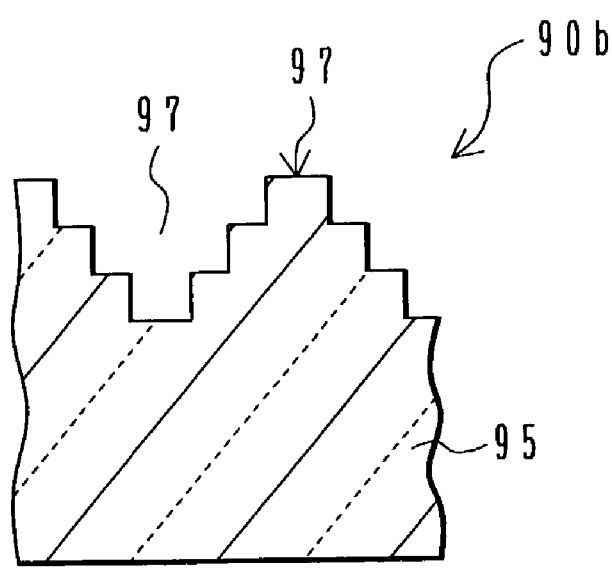
FIG. 4B is a cross sectional view showing part of a spectral device constituted of a diffraction device having another diffraction grating pattern.

FIG. 4B is a schematic cross sectional view showing part of the spectral device 90b made of a diffraction optical device having another diffraction grating pattern 97. For example, the diffraction grating pattern 97 can be made by forming a number of grooves 97a whose inner surface is made stepwise, in a transparent resin layer 95. The spectral device 90b has the diffraction grating pattern 97 of the same shape in each spectral region.

By forming the inner surface of the grooves 97a stepwise, it becomes possible to spectroscopically diffract a plurality of red light fluxes having different wavelengths, a plurality of green light fluxes having different wavelengths and a plurality of blue light fluxes having different wavelengths toward desired regions.

The diffraction grating pattern 97 can be formed by a method similar to the method of forming the diffraction grating pattern 93 shown in FIG. 4A. In this case, patterning the transparent resin layer is performed a plurality of times by using masks having different shapes.

Each of the spectral devices 90a and 90b is disposed by using each diffraction grating pattern as the light reception plane.

The spectral device 90 may be made of a holographic device. A spectral device 90c of a holographic device can be made by, for example, changing refractive indices in the in-plane and depth directions of a transparent material layer made of organic photo refractive material in a predetermined refractive index pattern.

FIGS. 5A, 5B and 5C illustrate the manufacture method of the spectral device 90c. The following description takes as an example a method of manufacturing the spectral region 90A shown in FIG. 3 and is given by using identical reference symbols.

As shown in FIG. 5A, red light $L_{R1}$ having a desired wavelength is irradiated to one surface 98a of a transparent material layer 98 made of organic photo refractive material, whereas red light $L_{R2}$ having the desired wavelength is irradiated to another surface 98b of the transparent material layer 98 via a slit S1 formed in a mask M1.

Red light fluxes $L_{R1}$ and $L_{R2}$ are monochromatic coherent fluxes having the same wavelength. The red light fluxes $L_{R1}$ incident upon the transparent material layer 98 are parallel light fluxes or converged light fluxes, whereas the red light fluxes $L_{R2}$ incident upon the transparent material layer 98 are diffused light fluxes.

Next, as shown in FIG. 5B, green light $L_{G1}$ having a desired wavelength is irradiated to the one surface 98a of a transparent material layer 98, whereas green light $L_{G2}$ having the desired wavelength is irradiated to the other surface 98b of the transparent material layer 98 via a slit S2 formed in a mask M2.

Green light fluxes $L_{G1}$ and $L_{G2}$ are monochromatic coherent fluxes having the same wavelength. The green light fluxes $L_{G1}$ incident upon the transparent material layer 98 are parallel light fluxes or converged light fluxes, whereas the green light fluxes $L_{G2}$ incident upon the transparent material layer 98 are diffused light fluxes.

Thereafter, as shown in FIG. 5C, blue light fluxes $L_{B1}$ having a desired wavelength are irradiated to the one surface 98a of a transparent material layer 98, whereas blue light fluxes $L_{B2}$ having the desired wavelength are irradiated to the other surface 98b of the transparent material layer 98 via a slit S3 formed in a mask M3.

Blue light fluxes $L_{B1}$ and $L_{B2}$ are monochromatic coherent fluxes having the same wavelength. The blue light fluxes $L_{B1}$ incident upon the transparent material layer 98 are parallel light fluxes or converged light fluxes, whereas the blue light fluxes $L_{B2}$ incident upon the transparent material layer 98 are diffused light fluxes.

As the red light fluxes $L_{R1}$ and $L_{R2}$, green light fluxes $L_{G1}$ and $L_{G2}$ and blue light fluxes $L_{B1}$ and $L_{B2}$ are sequentially irradiated to the transparent material layer 98, the irradiated light fluxes of the same color interfere with one another and change the refractive indices in the in-plane and depth directions of the transparent material layer 98. The spectral region 90A can therefore be formed in the transparent material layer 98.

The spectral regions 90B and 90C of the spectral device 90c can be formed in a similar manner.

The order of the processes shown in FIGS. 5A to 5C may be arbitrary and changed as desired.

The spectral device 90c manufactured as above is disposed by using the one surface 98a as the light reception plane.

Red light fluxes contained in light incident upon the spectral device 90c, i.e., red light fluxes having wavelengths being the same as and approximate to those of the red light fluxes $L_R$ used for the manufacture of the spectral device 90c, are spectroscopically split so as to pass through the region having the same shape and size as those of the slit S1 as viewed in plan, assuming that the space under the spectral device 90c is an air layer. The positional relation between this region and the spectral device 90c is generally the same as that between the slit S1 and the transparent material layer 98 used when the spectral device 90c was manufactured. The same relation can be applied to the green and blue light fluxes incident upon the spectral device 90c.

In practice, a plurality of layers exist between the spectral device 90c and semiconductor substrate 1. In manufacturing the spectral device 90c, therefore, the shape and size of each of the slits S1, S2 and S3 as viewed in plan as well as the positional relations between the transparent material layer 98 and the slits S1 to S3 during the manufacture of the spectral device 90c are determined in accordance with the layer structure of the solid state image pickup device to be manufactured and the refractive indices of layers relative to the red, green and blue light fluxes $L_R$, $L_G$ and $L_B$.

If a plurality of monochromatic light fluxes having different wavelengths are used for red, green and blue light to be used for the manufacture of the spectral device 90c, the spectral efficiency of each spectral region of the spectral device 90c can be increased.

There are a plurality of layers between the spectral device 90 and semiconductor substrate 1 shown in FIG. 2 or 3 as described above. The optical paths of the red, green and blue light fluxes $L_R$, $L_G$ and $L_B$ in the solid state image pickup device 100 are therefore different from those shown in FIG. 3. The spectral characteristics of the spectral device 90 are selected in accordance with the layer structure of the solid state image pickup device to be manufactured and the refractive indices of layers relative to the red, green and blue light fluxes $L_R$, $L_G$ and $L_B$.

A specific layer structure of a solid state image pickup device 100 will be detailed with reference to FIG. 6.

Figure 6:
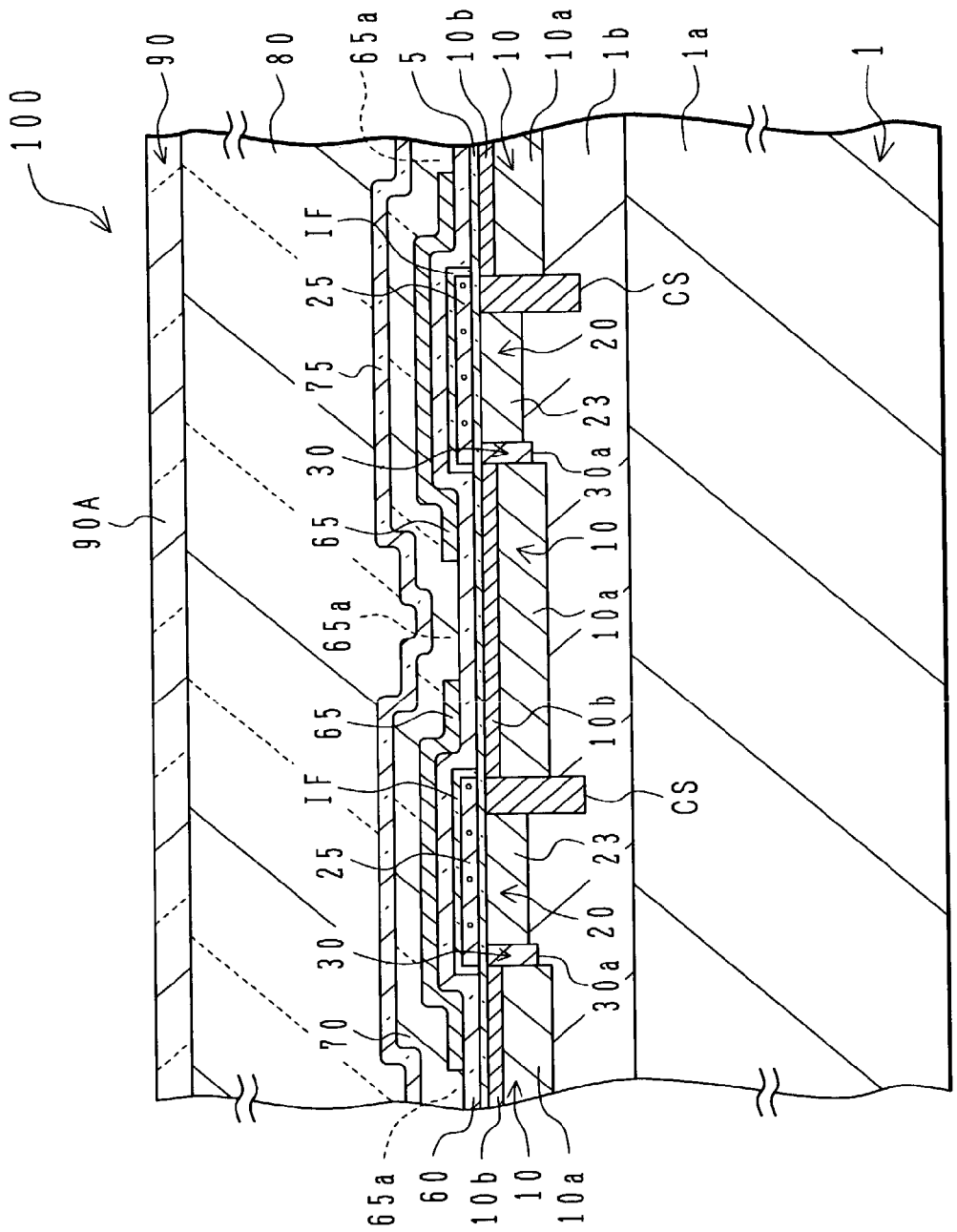
FIG. 6 is a schematic diagram showing the cross sectional structure of the solid state image pickup device taken along line VI—VI shown in FIG. 2.

FIG. 6 is a schematic cross sectional view of the solid state image pickup device 100 taken along line VI—VI shown in FIG. 2.

As shown in FIG. 6, a semiconductor substrate 1 has, for example, an n-type silicon substrate 1a and a p-type region 1b formed on the surface of the silicon substrate 1a. The p-type region 1b is formed by implanting p-type impurity ions into a surface layer of the n-type silicon substrate 1a and thereafter performing heat treatment, or by epitaxially growing p-type impurity containing silicon on a surface of the n-type silicon substrate 1a.

In the following description, in order to designate the degree of impurity concentrations, notations of a $p^-$-type region, a p-type region and a $p^+$-type region or an $n^-$-type region, an n-type region and an $n^+$-type region are used in the order of lower impurity concentration. All impurity-doped regions are preferably formed by ion implantation and heat treatment to follow, excepting that $p^-$-type regions may be formed by epitaxial growth.

A photoelectric conversion element 10 is, for example, a buried type photodiode which is formed by doping an n-type region 10a in the $p^-$-type region 1b and further changing the surface layer of the n-type region 10a to a $p^+$-type region 10b. The n-type region 10a functions as a charge accumulation region.

An n-type channel 23 is formed in the $p^-$-type region 1b for each photoelectric conversion element column. Each n-type channel has generally a uniform impurity concentration over the whole length thereof and extends along the corresponding photoelectric conversion element column. The n-type channel 23 functions as a charge transfer channel of a vertical charge transfer unit 20 (hereinafter called a "vertical charge transfer channel").

A p-type region 30a is disposed along the right edge of each photoelectric conversion element 10 (n-type region 10a) shown in FIG. 1 or 6. The length of the p-type region 30a in the column direction is about a half of the length of the photoelectric conversion element 10 in the column direction, for example. The p-type region 30a is used as a channel region 30a for a read gate 30.

If necessary, a p-type region is disposed under the vertical charge transfer channel 23.

A channel stopper region CS is disposed around the photoelectric conversion elements 10 and vertical charge transfer channels 23 as viewed in plan excepting the read gate channel region 30a, and around a charge transfer channel (hereinafter called a "horizontal charge transfer channel") constituting a horizontal charge transfer unit 40 (refer to FIG. 1) as viewed in plan. The channel stopper region CS is made of, for example, a $p^+$-type region.

If the horizontal charge transfer unit 40 is made of two-phase drive type CCDs, the horizontal charge transfer channel can be formed by alternately disposing an n-type region and an $n^-$-type region from the downstream side to the upstream side in this order.

In this specification, the motion of charges from the photoelectric conversion element 10 to the charge detector circuit 50 is regarded as one flow, and the relative position of each constituent element is identified by using phrases "at a downstream position from some element", "at an upstream position from some element" and the like if necessary.

A first electrically insulating layer 5 is disposed on the semiconductor substrate 1. As the first electrically insulating layer 5, for example, a thermally oxidized film is disposed on the surface of the photoelectric conversion element 10 and an oxide-nitride-oxide (ONO) film is disposed on surfaces of CCD areas.

For example, the ONO film is a lamination film of a silicon oxide film (thermally oxidized film) of about 20 to 70 nm thick, a silicon nitride film of about 30 to 80 nm thick and a silicon oxide film of about 10 to 50 nm thick stacked in this order on the semiconductor substrate 1. In FIG. 6, the first electrically insulating layer 5 is represented by one layer for the purposes of simplicity.

On the first electrically insulating layer 5, transfer electrodes constituting the vertical charge transfer unit 20 (hereinafter called "vertical transfer electrodes"), transfer electrodes constituting the horizontal charge transfer unit 40 (hereinafter called a "horizontal transfer electrodes"), and various electrodes constituting the charge detector circuit 50 (refer to FIG. 1) are formed.

These electrodes are formed, for example, by patterning a first polysilicon layer into predetermined electrodes, forming an oxide film on the substrate surface, and pattering a second polysilicon layer formed on the oxide film. Each electrode is covered with an electrically insulating film IF such as a thermally oxidized film.

A second electrically insulating layer 60 is formed covering the photoelectric conversion elements 10, vertical transfer electrodes, horizontal charge transfer unit 40 and charge detector circuit 50 to obtain a sufficient electrical isolation of a light shielding film 65 to be described later from underlying various electrodes. The second electrically insulating layer 60 is formed by depositing silicon oxide or the like by physical vapor deposition (PVD) or chemical vapor deposition (CVD).

The light shielding film 65 covers the vertical transfer electrodes, horizontal charge transfer unit 40 and charge detector circuit 50 as viewed in plan to prevent unnecessary photoelectric conversion in the area other than the photoelectric conversion elements 10. The light shielding film 65 can be formed by depositing metal such as tungsten, aluminum, chromium, titanium and molybdenum, or alloy of two or more metals, by PVD or CVD and patterning the deposited layer.

The light shielding film 65 has an opening 65a above each photoelectric conversion element 10 so as to allow light to enter the photoelectric conversion element 10. The area of each opening 65a as viewed in plan is, for example, about 20% of or smaller than the area of the photoelectric conversion element 10 as viewed in plan. A surface region of the photoelectric conversion element 10 positioned in the opening 65a as viewed in plan is the light reception plane of the photoelectric conversion element 10.

If other wiring patterns are formed by using material different from the material of the light shielding film 65, it is preferable to form an interlayer insulating film 70 on the light shielding film 65 as shown in FIG. 6.

The interlayer insulating film 70 can be formed by depositing silicon oxide or the like by PVD or CVD. If the wiring patterns are made of the same material as that of the light shielding film 65, the second electrically insulating layer 60 may be made thick to use it as the interlayer insulating film.

A passivation film 75 is formed on the interlayer insulating film 70 to protect underlying constituent elements. This passivation film 75 is formed by depositing silicon nitride or the like by PVD or CVD.

A planarizing film 80 is formed by spin coating light permissive organic material such as photoresist on the passivation film 75. The planarizing film 80 provides a flat surface on which a spectral device 90 is disposed.

The spectral device 90 is disposed on the planarizing film 80. Red, green and blue light fluxes incident upon the inner edge portion of the spectral regions 90A, 90B or 90C (refer to FIG. 1) of the spectral device 90 as viewed in plan become harder to be incident upon desired photoelectric conversion elements as the planarizing film 80 becomes thinner. Therefore, the thickness of the planarizing film 80 is properly selected so that red, green and blue light fluxes $L_R$, $L_G$ and $L_B$ spectroscopically split by the spectral device 90 enter the light reception planes of desired photoelectric conversion elements as much as possible.

Next, a solid state image pickup device of a second embodiment will be described.

Figure 7:
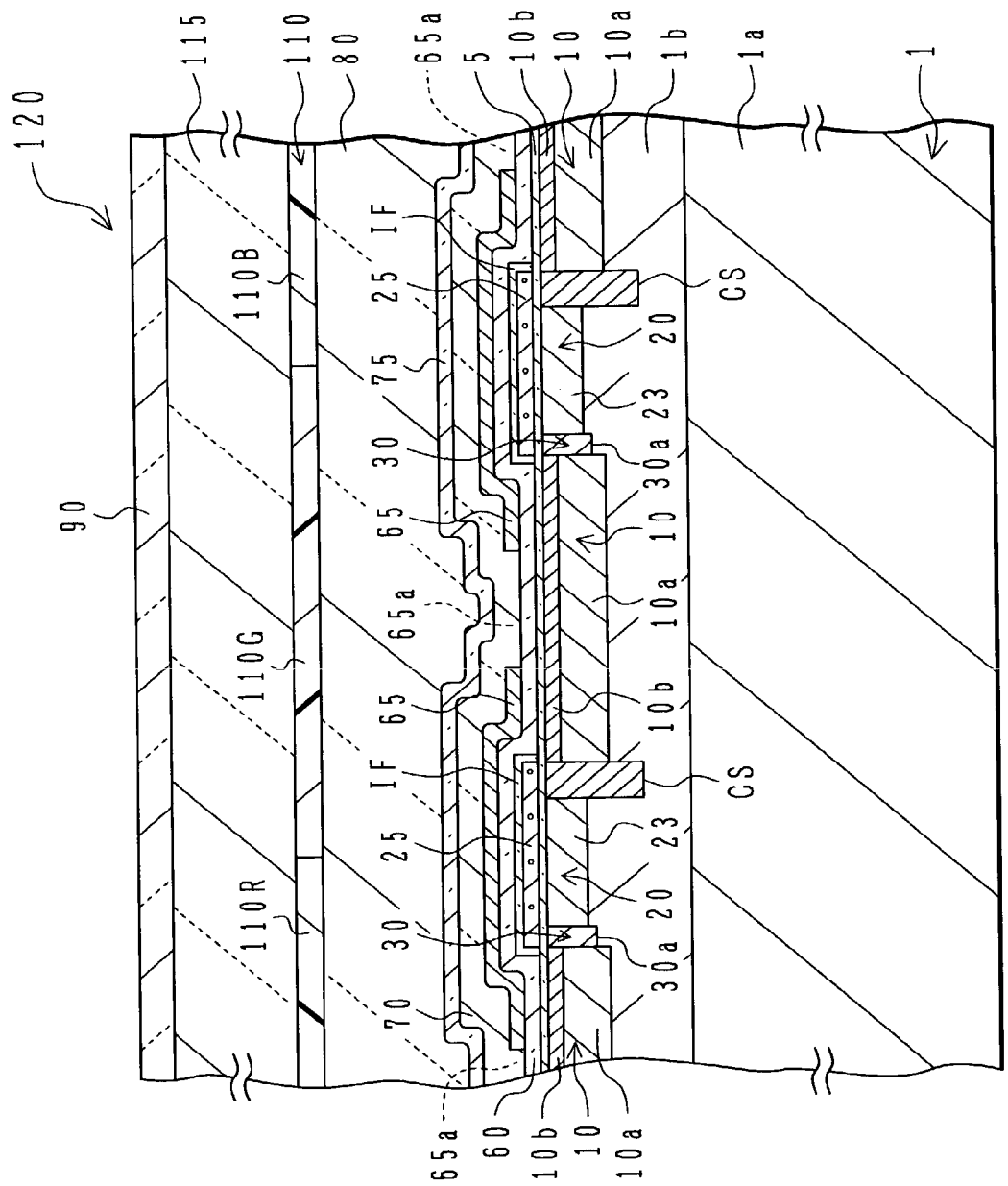
FIG. 7 is a schematic diagram showing the cross sectional structure of a solid state image pickup device according to a second embodiment.

FIG. 7 is a schematic cross sectional view of a solid state image pickup device 120 of the second embodiment. In FIG. 7, constituent elements common to those shown in FIG. 6 are represented by identical reference numerals and the description thereof is omitted.

In the solid state image pickup device 120, a color filter array 110, a second planarizing film 115, and a spectral device 90 are stacked in this order on a first planarizing film 80. The other structures are similar to those of the solid state image pickup device 100. The first planarizing film 80 is preferably made as thin as possible.

The color filter array 110 prevents light other than desired light from entering each photoelectric conversion element 10. A red filter 110R is disposed above the photoelectric conversion element 10 upon which red light spectroscopically split by the spectral device 90 is to be incident. A green filter 110G is disposed above the photoelectric conversion element 10 to which green light is to be applied. A blue filter 110B is disposed above the photoelectric conversion element 10 to which blue light is to be applied.

Each of color filters 110R, 110G and 110B may be disposed above each photoelectric conversion element or a stripe shaped color filter may be disposed above each photoelectric conversion element column.

Similar to the first planarizing film 80, the second planarizing film 115 is formed by spin coating light transmissive organic material such as photoresist. The thickness of the second planarizing film 115 is selected so that red, green and blue light fluxes spectroscopically split by the spectral device 90 enter the light reception planes of desired photoelectric conversion elements 10 as much as possible.

The solid state image pickup device 120 constructed as above provides similar effects to those of the solid state image pickup device 100 of the first embodiment. Since the color filter array 110 is formed in addition to the spectral device 90, an image having a high quality can easily be obtained by using output signals (pixel signals) of the solid state image pickup device 120.

Next, a solid state image pickup device of a third embodiment will be described.

Figure 8:
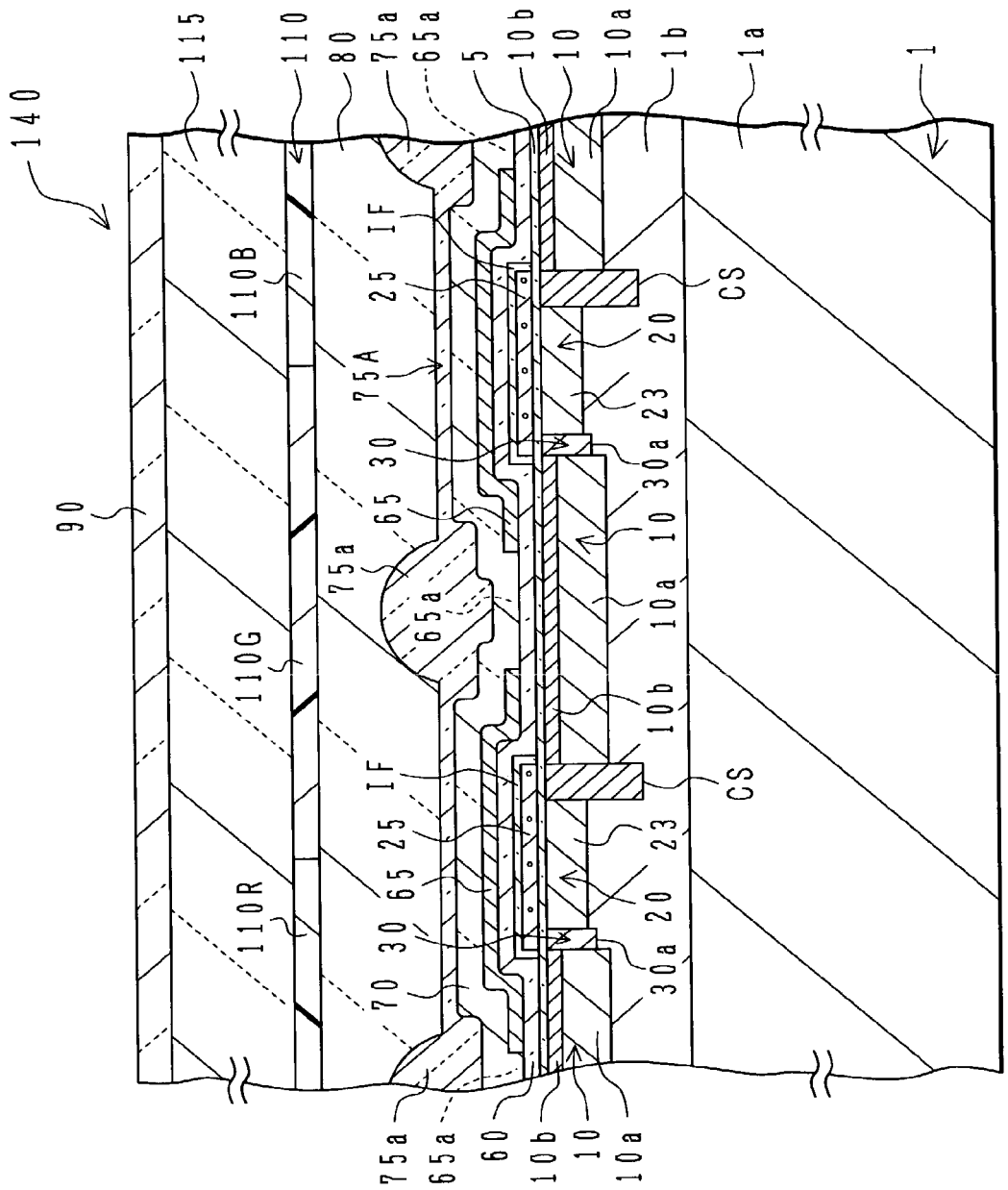
FIG. 8 is a schematic diagram showing the cross sectional structure of a solid state image pickup device according to a third embodiment.

FIG. 8 is a schematic cross sectional view of a solid state image pickup device 140 of the third embodiment. In FIG. 8, constituent elements common to those shown in FIG. 7 are represented by identical reference numerals and the description thereof is omitted.

In the solid state image pickup device 140, a predetermined region of a passivation film 75A above each photoelectric conversion element 10 functions as a micro lens 75a. The other structures are similar to the solid image pickup device 120.

The passivation film 75A can be formed by the following method for example.

First, a transparent material layer such as a silicon nitride layer is formed which can be used as the material of the passivation film and has a thickness sufficient for forming micro lenses 75a. On this transparent material layer, a micro lens array having a predetermined shape is formed. For example, the micro lens array is formed by segmenting a transparent resin (inclusive of photoresist) layer into areas having a predetermined shape by photolithography or the like, melting each area by heat treatment to round the corners of each area by surface tension, and thereafter cooling each area. Each area is molded into a micro lens.

Thereafter, the micro lens array and underlying transparent layer are etched so that the cubic shape of the micro lens array can be transferred to the transparent material layer. The passivation film 75A having the areas functioning as the micro lens 75a can be obtained.

The solid state image pickup device 140 constructed as above provides similar effects to those of the solid state image pickup device 120 of the second embodiment. Since the micro lens 75a is formed above each photoelectric conversion element 10, the amount of light of each color incident upon the photoelectric conversion element 10 can be increased. The sensitivity of the solid state image pickup device can further be increased.

Next, a solid state image pickup device of a fourth embodiment will be described.

Figure 9:
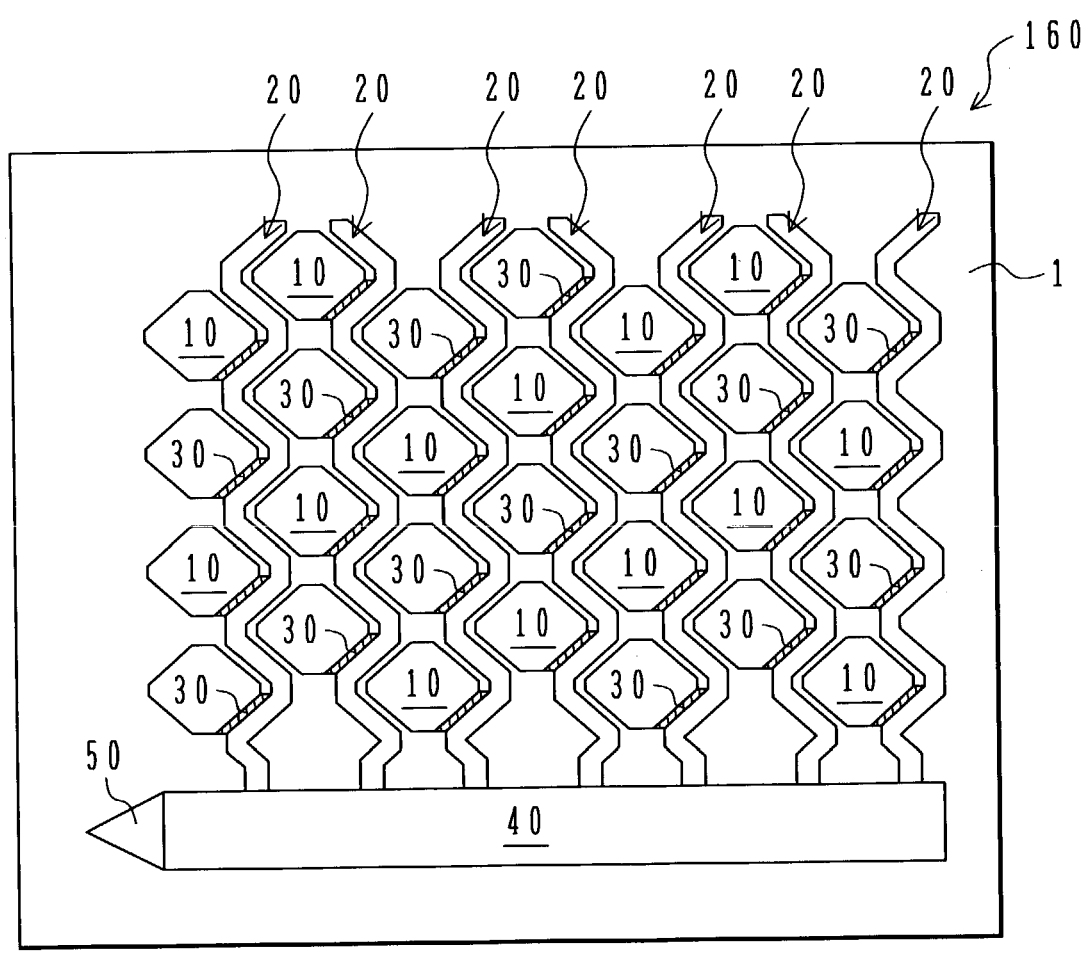
FIG. 9 is a schematic diagram showing a plan layout of photoelectric conversion elements, first charge transfer units (vertical charge transfer units), a second charge transfer unit (horizontal charge transfer unit) and a charge detector circuit, respectively of a solid state image pickup device according to a fourth embodiment.

FIG. 9 is a schematic plan view showing the layout of photoelectric conversion elements 10, vertical charge transfer units 20, a horizontal charge transfer unit 40 and a charge detector circuit 50, respectively of the solid state image pickup device 160 of the fourth embodiment.

The solid state image pickup device 160 has the structure similar to the solid state image pickup device 100 of the first embodiment, excepting that a number of photoelectric conversion elements 10 are disposed in a pixel shift layout, that each vertical charge transfer unit 20 has a zigzag shape, and the spectral characteristics of the spectral device to be described later.

The "pixel shift layout" of a number of photoelectric conversion elements used in this specification is the layout that each photoelectric conversion element in the odd number photoelectric conversion element column (row) is shifted in the column (row) direction by about a half pitch of photoelectric conversion elements in the column (row) direction from each photoelectric conversion element in the even number photoelectric conversion element, and that each photoelectric conversion element column contains only even or odd photoelectric conversion elements. The "pixel shift layout" is one of the layouts wherein a number of photoelectric conversion elements are disposed in a matrix shape having a plurality of rows and columns.

The phrase "about a half pitch of photoelectric conversion elements in the column (row) direction" is intended to include also the pitch regarded as substantially equal to the half pitch from the performance and image quality although this pitch is different from the correct half pitch because of manufacture tolerances, rounding errors of pixel positions to be caused by design or mask manufacture, or the like.

Constituent elements functionally common to those shown in FIG. 9 are all shown in FIG. 1. In FIG. 9, constituent elements functionally common to those shown in FIG. 1 are represented by identical reference numerals and the description thereof is omitted.

If a number of photoelectric conversion elements 10 are disposed in the pixel shift layout, the integration of photoelectric conversion elements 10 can be increased by making each vertical charge transfer unit 20 have a zigzag shape as shown in FIG. 9.

Figure 10:
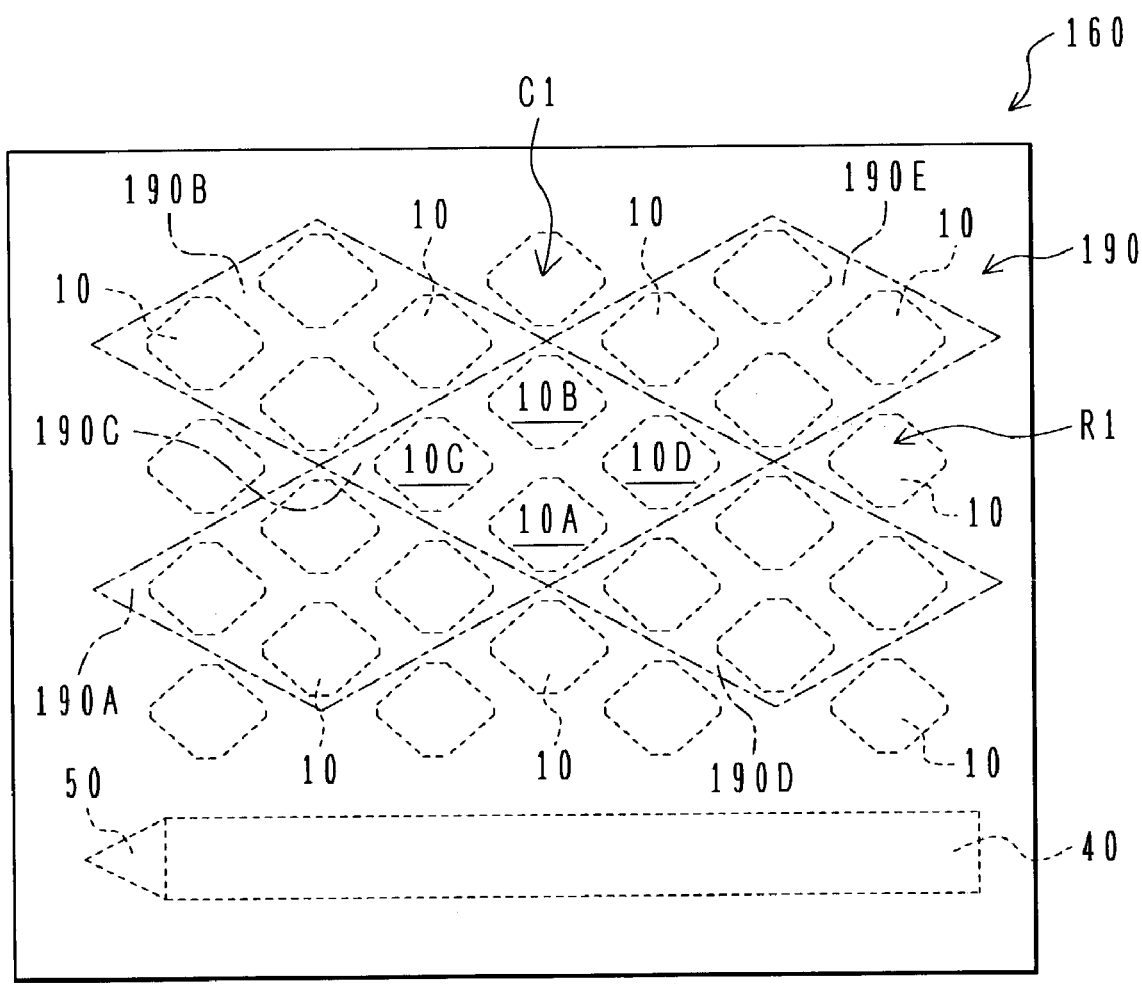
FIG. 10 is a top view schematically showing the solid state image pickup device shown in FIG. 9.

FIG. 10 is a schematic top view showing the solid state image pickup device 160. A spectral device 190 is disposed at the top of the solid state image pickup device 160.

In the example shown in FIG. 10, the spectral device 190 has five spectral regions 190A to 190E. The plan shape of each of the spectral regions 190A to 190E is a rhomboid having a diagonal line extending along the photoelectric conversion element row direction and a diagonal line extending along the photoelectric conversion element column direction. Each spectral region corresponds to adjacent four photoelectric conversion elements 10.

The four photoelectric conversion elements corresponding to each spectral region accumulate charges corresponding to the signals (pixel signals of four kinds) of the minimum unit necessary for interpolation. The interpolation process is executed when pixel signals for image reproduction are generated from output signals (pixel signals) of the solid state image pickup device 160.

Description will be made by taking as an example four photoelectric conversion elements 10A, 10B, 10C and 10D corresponding to the spectral region 190C.

Figure 11:
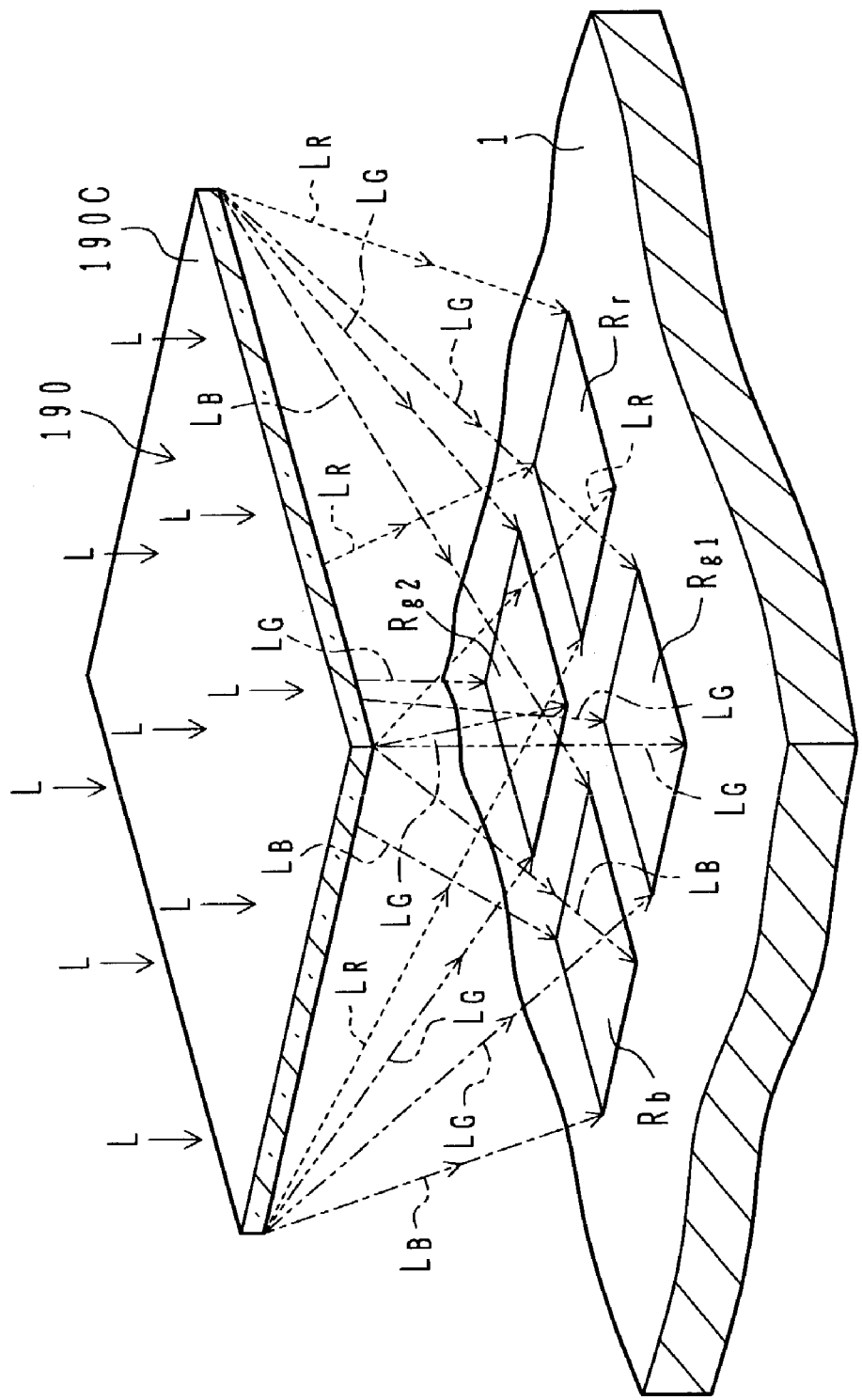
FIG. 11 is a perspective view showing the spectral characteristics of a spectral region shown in FIG. 10.

FIG. 11 is a perspective view showing the spectral characteristics of the spectral region 190C shown in FIG. 10. As shown, the spectral device 190C spectroscopically splits red, green and blue light fluxes $L_R$, $L_G$ and $L_B$ contained in incident light L toward different directions. Assuming that the refractive indices in the region between the spectral region 190C and semiconductor substrate 1 are uniform, the red light $L_R$ is spectroscopically split toward a surface region $R^r$ of the semiconductor substrate 1, the green light $L_G$ is spectroscopically split toward a surface region $R_g$, and the blue light $L_B$ is spectroscopically split toward a surface region $R_b$.

The spectral characteristics of the spectral regions 190A, 190B, 190D and 190E have similar characteristics to those of the spectral region 190C.

In practice, a plurality of layers exist between the spectral device 190 and semiconductor substrate 1. In the solid state image pickup device 160, the light reception plane of the photoelectric conversion element 10A corresponding to the spectral region 190C is positioned in a region $R_{g1}$, the light reception plane of the photoelectric conversion element 10B is positioned in a region $R_{g2}$, the light reception plane of the photoelectric conversion element 10C is positioned in a region $R_b$, and the light reception plane of the photoelectric conversion element 10D is positioned in a region $R_r$. The positional relation between four photoelectric conversion elements 10 and each of the other spectral regions 190A, 190B, 190D and 190E is the same as the positional relation between the photoelectric conversion elements 10A to 10D and the spectral region 190C.

The spectral device 190 is preferably a holographic device. The spectral device 190 made of a holographic device can be manufactured by a method similar to that already described with FIG. 5. When green light is irradiated to the transparent material layer, two slits are used to obtain the spectral device capable of spectroscopically splitting green light toward two areas as shown in FIG. 11.

This solid state image pickup device 160 has similar effects to those of the solid state image pickup device 100 of the first embodiment.

Also in the solid state image pickup device having a number of photoelectric conversion elements disposed in the pixel shift layout, a color filter array may be disposed under the spectral device, similar to the solid state image pickup device 120 of the second embodiment. Similar to the solid state image pickup device 140 of the third embodiment, a passivation film may be formed in which the passivation film region above each photoelectric conversion element functions as a micro lens.

A micro lens array manufacture method, solid state image pickup devices and their manufacture methods have been described above. The invention is not limited only to the above embodiments.

The structures of the solid state image pickup device other than the spectral device may be changed in various ways depending upon the application, performance and the like.

For example, if a number of photoelectric conversion elements are disposed in a tetragonal matrix shape, two or three vertical transfer electrodes may be formed for each photoelectric conversion element row.

Figure 12:
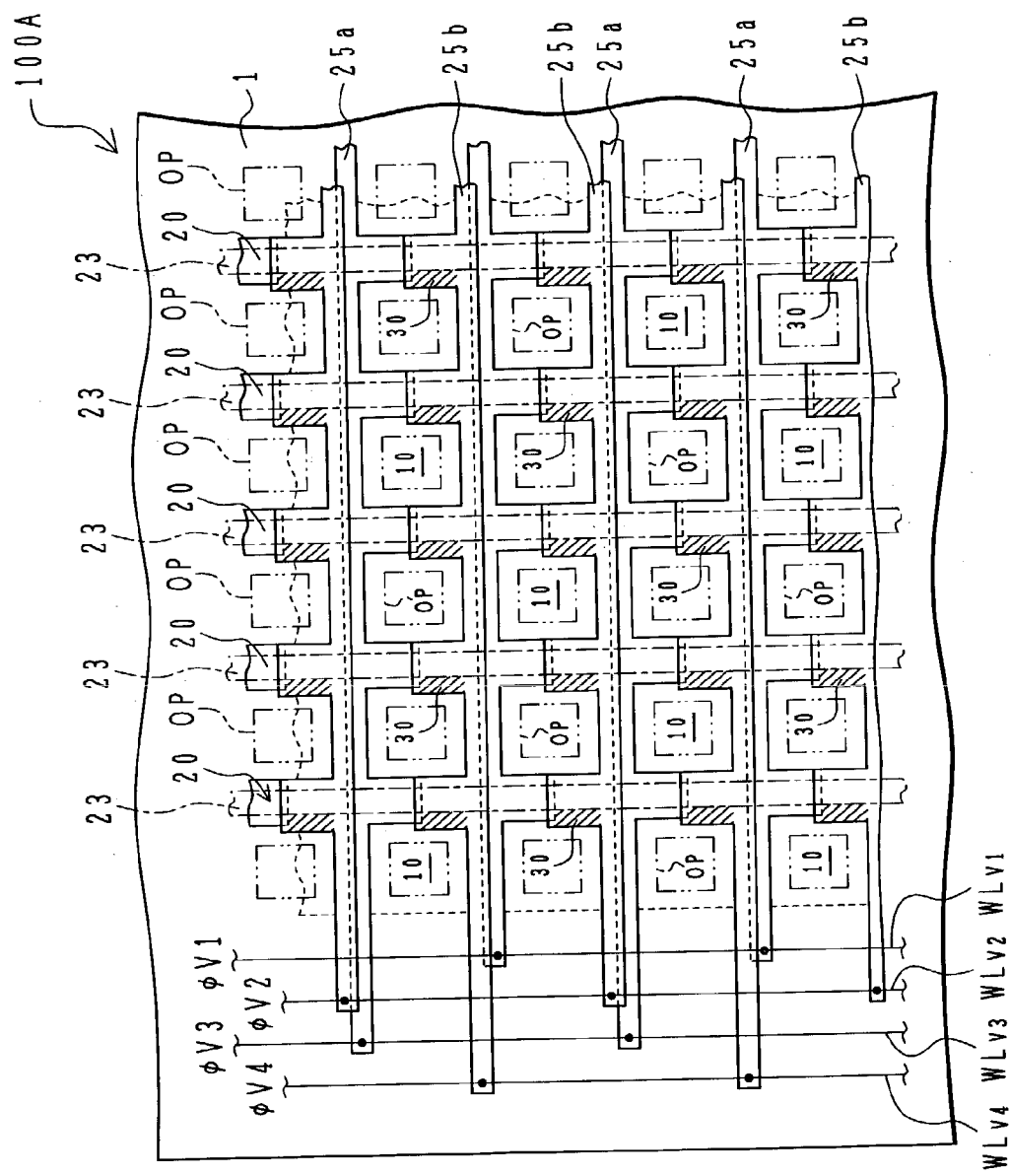
FIG. 12 is a schematic diagram showing a solid state image pickup device wherein a number of photoelectric conversion elements are disposed in a square matrix shape and each vertical charge transfer unit has two vertical transfer electrodes per one photoelectric conversion element row.

FIG. 12 is a schematic diagram showing a solid state image pickup device 100A wherein a number of photoelectric conversion elements 10 are disposed in a tetragonal matrix shape and each vertical charge transfer unit 20 has two first and second vertical transfer electrodes 25a and 25b per one photoelectric conversion element row.

Each vertical charge transfer unit 20 is constituted of four-phase drive type CCDs which are driven by four-phase drive signals $\phi V1$ to $\phi V4$ supplied via wiring lines $WL_{v1}$ to $WL_{v4}$. Each vertical charge transfer channel 23 extends linearly along the photoelectric conversion element column.

The first vertical transfer electrode 25a is disposed at the upstream position of the photoelectric conversion element row, traversing the vertical charge transfer channels 23 as viewed in plan, and the second vertical transfer electrode 25b is disposed at the downstream position of the photoelectric conversion element row. The first and second vertical charge transfer electrodes 25a and 25b extend along the photoelectric conversion element row, and one ends of the second vertical transfer electrode 25b overlap one ends of the first vertical transfer electrode 25a above the vertical charge transfer channel 23.

If necessary, a plurality of vertical transfer electrodes, e.g., three vertical transfer electrodes, are disposed at the downstream position of the most downstream second vertical transfer electrode 25b.

Although not shown in FIG. 12, similar to the solid state image pickup device 100, the solid state image pickup device 100A may have a second electrically insulating layer, a light shielding film, an interlayer insulating film, a passivation film, a first planarizing film sequentially disposed over a semiconductor substrate 1, and a spectral device formed on the first planarizing film. Similar to the solid state image pickup device 120 of the second embodiment, a color filter array may be formed under the spectral device. Similar to the solid state image pickup device 140 of the third embodiment, a passivation film may be formed wherein a region of the passivation film above a photoelectric conversion element functions as a micro lens.

Figure 13:
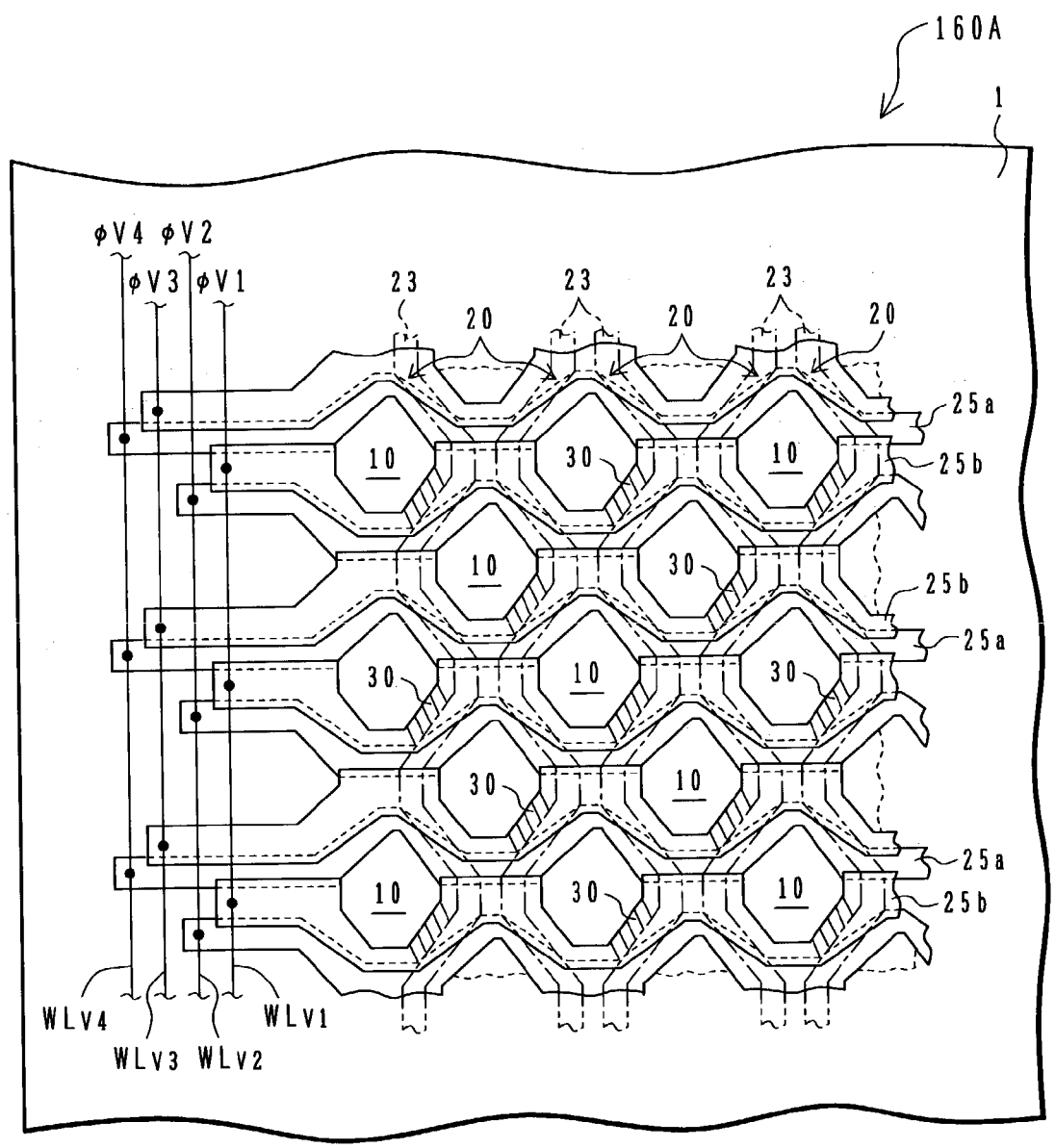
FIG. 13 is a schematic diagram showing a solid state image pickup device wherein a number of photoelectric conversion elements are disposed in a pixel shift layout and each vertical charge transfer unit has two vertical transfer electrodes per one photoelectric conversion element row.

FIG. 13 is a schematic diagram showing a solid state image pickup device 160A wherein a number of photoelectric conversion elements are disposed in the pixel shift layout and each vertical charge transfer unit 20 has first and second vertical transfer electrodes 25a and 25b per one photoelectric conversion element row.

All constituent elements having functions common to those of the constituent elements shown in FIG. 13 are shown in FIG. 12. In FIG. 13, constituent elements having functions common to those of the constituent elements shown in FIG. 12 are represented by identical reference numerals and the description thereof is omitted.

In the pixel shift layout of a number of photoelectric conversion elements 10, it is preferable that each vertical charge transfer channel 23 extends in a zigzag way along the photoelectric conversion element column and each of the first and second vertical transfer electrodes 25a and 25b extends in a zigzag way along the photoelectric conversion element row.

The solid state image pickup device 160A may also have the above-described lamination structure and additional elements.

In both the square matrix layout and pixel shift layout of a number of photoelectric conversion elements, the number of phases of drive signals for driving the vertical and horizontal charge transfer units is determined in accordance with the number of vertical transfer electrodes per one photoelectric conversion element row, the number of horizontal transfer electrodes per one vertical charge transfer unit, or the methods of driving the vertical or horizontal charge transfer units. The horizontal charge transfer unit may be formed by disposing two or more horizontal transfer electrodes per one vertical charge transfer unit.

The spectral device 90 described with FIGS. 2 and 3 and the spectral device 190 described with FIGS. 10 and 11 may be applied to a MOS solid state image pickup device.

Figure 14A:
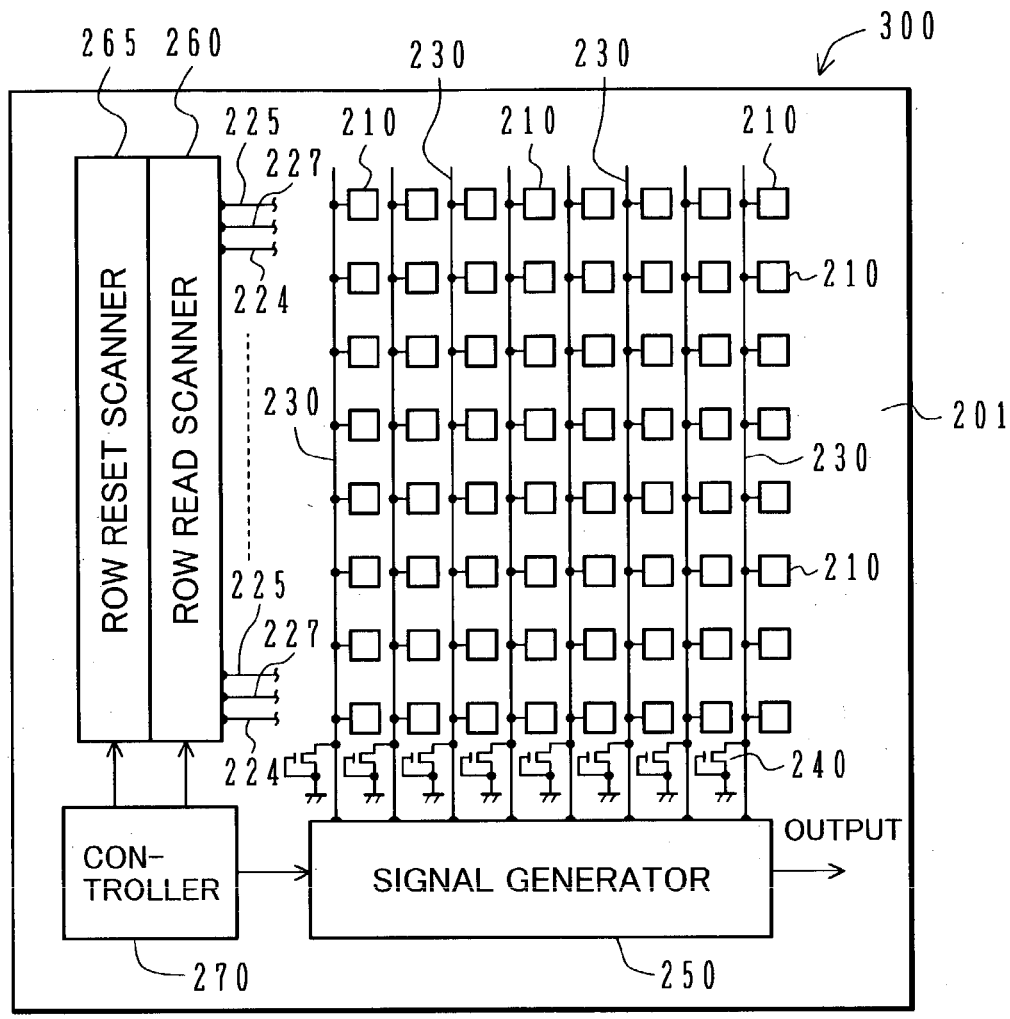
FIG. 14A is a schematic diagram showing the layout of photoelectric conversion elements and an output signal generator unit of a MOS solid state image pickup device used as an area image sensor.

FIG. 14A is a schematic diagram showing the layout of photoelectric conversion elements and an output signal generator unit of a MOS solid state image pickup device used as an area image sensor.

The solid state image pickup device 300 has a number of photoelectric conversion elements 210 disposed on the surface of a semiconductor substrate 201 in a square matrix shape having a plurality of rows and columns. A switching circuit (not shown) is formed for each photoelectric conversion element 210.

An output signal line 230 is formed along the photoelectric conversion element column for each photoelectric conversion element column. A load transistor 240 is connected to each output signal line 230. The output signal lines 230 are connected to the signal generator unit 250.

As light becomes incident upon the photoelectric conversion element 210, charges are accumulated in the photoelectric conversion element 210. By properly controlling the switching circuit, an electric signal corresponding to the amount of charges accumulated in the photoelectric conversion element 210 can be output to the output signal line 230. This electric signal is detected and converted into a predetermined output signal (pixel signal) by the signal generator unit 250 and is output therefrom. This signal is an output of the solid state image pickup device 300.

In order to control the operation of the switching circuit connected to each photoelectric conversion element 210 in the unit of photoelectric conversion element row, a row read scanner 260 and a row reset scanner 265 are disposed on the semiconductor substrate 201.

The row read scanner 260 controls the operation of each switching circuit to establish an electrical connection between each photoelectric conversion element 210 and output signal line 230. The row reset scanner 265 controls the operation of each switching circuit to drain charges accumulated in the photoelectric conversion element 210.

In order to send signals necessary for such controls, a row select signal line 224 and a reset signal line 227 are disposed for each photoelectric conversion element column. A power supply voltage line 225 is disposed for each photoelectric conversion element row or column. The signal lines and voltage line can be electrically connected to each switching circuit.

A controller 270 is disposed on the semiconductor substrate 201 to control the operations of the signal generator unit 250, row read scanner 260 and row reset scanner 265.

Figure 14B:
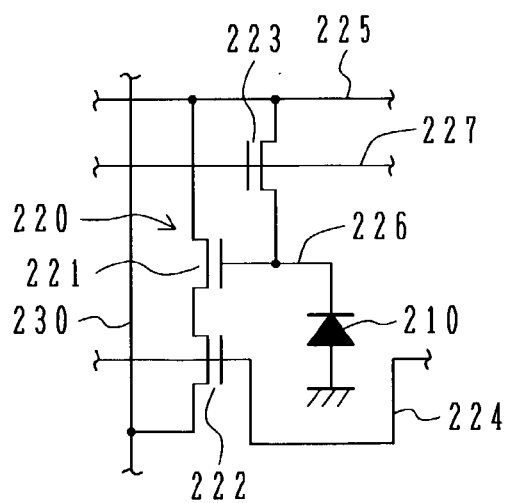
FIG. 14B is a circuit diagram showing an example of a switching circuit connected to each photoelectric conversion element shown in FIG. 14A.

FIG. 14B shows an example of the switching circuit. The switching circuit 220 includes an output transistor 221, a row select transistor 222 and a reset transistor 223. These transistors are, for example, MOS transistors.

The output transistor 221 and row select transistor 222 are serially connected, the photoelectric conversion element 210 is connected to the gate of the output transistor 222, and the row select signal line 224 is connected to the gate of the row select transistor 222. The remaining end of the output transistor is connected to the power supply voltage line 225 and the remaining end of the row select transistor 222 is connected to the output signal line 230.

The reset transistor 223 is connected to a wiring line 226 interconnecting the output transistor 222 and photoelectric conversion element 210, and to the power supply voltage line 225. A reset signal line 227 is connected to the gate of the reset transistor 223.

The switching circuit 220, output signal line 230, load transistor 240, signal generator unit 250, row read scanner 260 and row reset scanner 265 constitute an output signal generator unit.

When a read signal is supplied from the row read scanner 260 to the row select signal line 224, the row select transistor 222 connected to the row select signal line 224 turns on. The output transistor 221 is therefore electrically connected to the output signal line 230.

The voltage applied to the gate of the output transistor 221 changes in accordance with the amount of charges accumulated in the photoelectric conversion element 210 connected to the output transistor 221. Therefore, the drain current flowing through the output transistor 221 changes in accordance with the amount of charges accumulated in the photoelectric conversion element 210. When the row select transistor 222 turns on, an electric signal corresponding to the amount of charges accumulated in the photoelectric conversion element 210 is output to the output signal line 230.

When a reset signal is supplied from the row reset scanner 265 to the reset signal line 227, the reset transistor 223 connected to the reset signal line 227 turns on. The photoelectric conversion element 210 corresponding to the reset transistor 223 is therefore connected to the power supply voltage line 225 and charges accumulated in the photoelectric conversion element 210 are drained to the power supply voltage line 225.

Similar to the solid state image pickup device 100, the MOS solid state image pickup device 300 may have a second electrically insulating layer, a light shielding film, an interlayer insulating film, a passivation film, a first planarizing film sequentially disposed over the semiconductor substrate 201, and a spectral device formed on the first planarizing film. Similar to the solid state image pickup device 120 of the second embodiment, a color filter array may be formed under the spectral device. Similar to the solid state image pickup device 140 of the third embodiment, a passivation film may be formed wherein a region of the passivation film above a photoelectric conversion element functions as a micro lens.

The number of spectral regions of a spectral device and its layout can be determined in accordance with the number of photoelectric conversion elements formed in a semiconductor substrate and their layout, a method of driving a vertical charge transfer unit, a method of processing a signal in an image pickup apparatus using a solid state image pickup device, and the like.

The area of each spectral region as viewed in plan is preferably larger than a sum of areas of two photoelectric conversion elements as viewed in plan. If light spectroscopically split on each photoelectric conversion element is the light incident upon the spectral device far apart from the photoelectric conversion element, the quality of an image reproduced from output signals (pixel signals) of the solid state image pickup device is degraded.

It is preferable to form each spectral region of a spectral device so that light spectroscopically split on one photoelectric conversion element corresponding to the spectral region is the light incident upon the spectral device above another photoelectric conversion element in the range of about two rows and three columns as counted from the photoelectric conversion element.

If a spectral device is made of a diffraction optical element having a diffraction grating pattern, the shape of the diffraction grating pattern to be formed on each spectral region can be determined in accordance with the target spectral characteristics.

A method of manufacturing a spectral device can be selected in accordance with the target spectral characteristics, productivity and the like.

A solid state image pickup device may be made of a discrete spectral device separated from other constituent elements. In this case, the underlying layer of the spectral device integrated with other constituent elements can be omitted. However, members for supporting the spectral device at a predetermined position are required.

A glue structure of a spectral device glued to a predetermined underlying layer may be used as the structure of the solid state image pickup device.

If the structure of a spectral device separated from other constituent elements or the glue structure is incorporated into the structure of the solid state image pickup device, the degree of freedom of selecting material of the spectral device can be increased.

It is apparent that various modifications, improvements, combinations, and the like can be made by those skilled in the art.

What we claim are:

1. A solid state image pickup device, comprising:
   a semiconductor substrate;
   a number of photoelectric conversion elements disposed in a surface layer of said semiconductor substrate in a matrix shape having a plurality of rows and columns;
   an output signal generator unit capable of generating an output signal from charges accumulated in each of said photoelectric conversion elements; and
   a spectral device disposed above said semiconductor substrate and covering said photoelectric conversion elements as viewed in plan, said spectral device having a plurality of spectral regions each corresponding to a plurality of photoelectric conversion elements, each of the spectral regions spectroscopically splitting light fluxes of a plurality of colors necessary for color imaging and contained in incidence light toward different directions, each of the spectroscopically split light fluxes becoming incident upon an associated photoelectric conversion element among the plurality of photoelectric conversion elements corresponding to each of the spectral regions, wherein:

said number of photoelectric conversion elements are disposed in a pixel shift layout; and each of the plurality of spectral regions is disposed in correspondence with four photoelectric conversion elements and makes a first color light flux contained in the incidence light enter one of the four photoelectric conversion elements, a second color light flux enter another of the four photoelectric conversion elements, and a third color light flux enter remaining two of the four photoelectric conversion elements.

2. A solid state image pickup device according to claim 1, wherein the first color light flux is a red light flux, the second color light flux is a blue light flux, and the third color light flux is a green light flux.

3. A solid state image pickup device according to claim 1, wherein said spectral device is a holographic device.

4. A solid state image pickup device 1, comprising:
a semiconductor substrate;
a number of photoelectric conversion elements disposed in a surface layer of said semiconductor substrate in a matrix shape having a plurality of rows and columns;
an output signal generator unit capable of generating an output signal from charges accumulated in each of said photoelectric conversion elements; and
a spectral device disposed above said semiconductor substrate and covering said photoelectric conversion elements as viewed in plan, a surface of said spectral device having a diffraction grating pattern, said spectral device having a plurality of spectral regions each corresponding to a plurality of photoelectric conversion elements, each of the spectral regions spectroscopically splitting light fluxes of a plurality of colors necessary for color imaging and contained in incidence light toward different directions, each of the spectroscopically split light fluxes becoming incident upon an associated photoelectric conversion element among the plurality of photoelectric conversion elements corresponding to each of the spectral regions, wherein:
said number of photoelectric conversion elements are disposed in a pixel shift layout; and
each of the plurality of spectral regions is disposed in correspondence with four photoelectric conversion elements and makes a first color light flux contained in the incidence light enter one of the four photoelectric conversion elements, a second color light flux enter another of the four photoelectric conversion elements, and a third color light flux enter remaining two of the four photoelectric conversion elements.

5. A solid state image pickup device according to claim 4, wherein the first color light flux is a red light flux, the second color light flux is a blue light flux, and the third color light flux is a green light flux.

* * * * *